(12) United States Patent
Krishnamurthy et al.

(10) Patent No.: US 11,847,743 B2
(45) Date of Patent: Dec. 19, 2023

(54) VOICE DRIVEN MODIFICATION OF PHYSICAL PROPERTIES AND PHYSICS PARAMETERIZATION IN A CLOSED SIMULATION LOOP FOR CREATING STATIC ASSETS IN COMPUTER SIMULATIONS

(71) Applicant: Sony Interactive Entertainment Inc., Tokyo (JP)

(72) Inventors: Sudha Krishnamurthy, San Mateo, CA (US); Michael Taylor, San Mateo, CA (US)

(73) Assignee: Sony Interactive Entertainment Inc., Tokyo (JP)

( * ) Notice: Subject to any disclaimer, the term of this patent is extended or adjusted under 35 U.S.C. 154(b) by 122 days.

(21) Appl. No.: 17/308,023

(22) Filed: May 4, 2021

(65) Prior Publication Data

US 2022/0358718 A1 Nov. 10, 2022

(51) Int. Cl.
| | |
|---|---|
| *G06T 17/10* | (2006.01) |
| *G06T 15/50* | (2011.01) |
| *G10L 15/26* | (2006.01) |
| *G06N 3/044* | (2023.01) |

(52) U.S. Cl.
CPC ............ *G06T 17/10* (2013.01); *G06N 3/044* (2023.01); *G06T 15/503* (2013.01); *G10L 15/26* (2013.01); *G06T 2210/21* (2013.01); *G06T 2210/28* (2013.01)

(58) Field of Classification Search
CPC ......... G06T 17/00–30; G06T 19/00–20; G06T 15/503; G06T 2210/21; G06T 2210/28; G06N 3/0445; G10L 15/26
See application file for complete search history.

(56) References Cited

U.S. PATENT DOCUMENTS

| | | | |
|---|---|---|---|
| 9,566,122 B2 | 2/2017 | Bowling et al. | |
| 2005/0075154 A1* | 4/2005 | Bordes | A63F 13/577 463/1 |
| 2018/0095450 A1* | 4/2018 | Lappas | B22F 10/80 |
| 2020/0042656 A1 | 2/2020 | Zapolsky et al. | |
| 2020/0301799 A1 | 9/2020 | Manivasagam et al. | |

FOREIGN PATENT DOCUMENTS

| | | |
|---|---|---|
| WO | 2015023670 A1 | 2/2015 |
| WO | 2018236573 A1 | 12/2018 |

OTHER PUBLICATIONS

Bächer, Moritz, et al. "Spin-it: Optimizing moment of inertia for spinnable objects." ACM Transactions on Graphics (TOG) 33.4 (2014): 1-10. (Year: 2014).*

(Continued)

*Primary Examiner* — Daniel F Hajnik
(74) *Attorney, Agent, or Firm* — John L. Rogitz; John M. Rogitz

(57) ABSTRACT

A computer simulation object such as a chair is described by voice or photo input to render a 2D image. Machine learning may be used to convert voice input to the 2D image. The 2D image is converted to a 3D object and the 3D object or portions thereof are used in the computer simulation, such as a computer game, as the object such as a chair. A physics engine can be used to modify the 3D objects.

12 Claims, 11 Drawing Sheets

(56) References Cited

OTHER PUBLICATIONS

Saul, Greg, et al. "SketchChair: an all-in-one chair design system for end users." Proceedings of the fifth international conference on Tangible, embedded, and embodied interaction. 2010. (Year: 2010).*
Gan, Chuang, et al. "Threedworld: A platform for interactive multi-modal physical simulation." arXiv preprint arXiv:2007.04954 (2020). https://arxiv.org/abs/2007.04954v1 (Year: 2020).*
Wang, Ziqi, et al. "Design and structural optimization of topological interlocking assemblies." ACM Transactions on Graphics (TOG) 38.6 (2019): 1-13. (Year: 2019).*
Umetani, Nobuyuki, Takeo Igarashi, and Niloy J. Mitra. "Guided exploration of physically valid shapes for furniture design." ACM Transactions on Graphics (TOG) 31.4 (2012): 1-11. (Year: 2012).*
Senatore, Gennaro, and Daniel Piker. "Interactive real-time physics: an intuitive approach to form-finding and structural analysis for design and education." Computer-Aided Design 61 (2015): 32-41. (Year: 2015).*
Vyas, Bharat, "Real-time Physics Based Character Control carrying Load." (2020). B. Tech Dissertation. (Year: 2020).*
Wrotek, Pawel, Odest Chadwicke Jenkins, and Morgan McGuire. "Dynamo: dynamic, data-driven character control with adjustable balance." Proceedings of the 2006 ACM SIGGRAPH symposium on Videogames. 2006. (Year: 2006).*
"International Search Report and Written Opinion", dated Sep. 23, 2022, from the counterpart PCT application PCT/US22/26783.

* cited by examiner

VOICE DRIVEN MODIFICATION OF
PHYSICAL PROPERTIES AND PHYSICS
PARAMETERIZATION IN A CLOSED
SIMULATION LOOP FOR CREATING
STATIC ASSETS IN COMPUTER
SIMULATIONS

FIELD

The present application relates to technically inventive, non-routine solutions that are necessarily rooted in computer technology and that produce concrete technical improvements.

BACKGROUND

As understood herein, commonly used computer game assets such as common background objects are used to increase the visible appeal of computer games.

SUMMARY

Present principles allow content creators to describe the asset they want as a natural language input and create a 2D or 3D asset from that (voice) input. Creating initial prototype assets for artists to iterate on is also facilitated.

Accordingly, a method includes using at least one neural network, generating a three-dimensional (3D) object of a computer simulation asset. The method includes processing information associated with the asset using at least one physics engine to render an output. Further, the method includes feeding the output back to the neural network and receiving from the neural network a modified asset in response to feeding back the output of the physics engine to the neural network.

In some examples the method includes rendering the output of the physics engine at least in part by maintaining constant inertial tensors associated with the information associated with the asset. If desired, the method may include inputting at least one rule to the neural network for use in generating the 3D object. In non-limiting implementations the method includes rendering the output of the physics engine at least in part by modifying the information associated with the asset to maintain zero torque on the asset. The method can include inputting to the neural network information defining how the asset absorbs force.

In another aspect, a device includes at least one processor programmed with instructions to identify at least one three-dimensional (3D) asset for a computer simulation. The instructions are executable to input the 3D asset to at least one physics engine, and using at least one neural network, modify at least one property of the asset geometry to maintain constant inertial tensors calculated by the physics engine to tend to move or deform the asset.

In another aspect, an assembly includes at least one processor and at least one display configured for being controlled by the processor to present at least one 3D asset for a computer simulation on the display. The processor is programmed with instructions to input the 3D asset to at least one physics engine and maintain total torques on various portions of the 3D asset to be zero by varying at least one emulated physical property of the 3D asset.

The details of the present application, both as to its structure and operation, can best be understood in reference to the accompanying drawings, in which like reference numerals refer to like parts, and in which:

DETAILED DESCRIPTION

Figure 1:
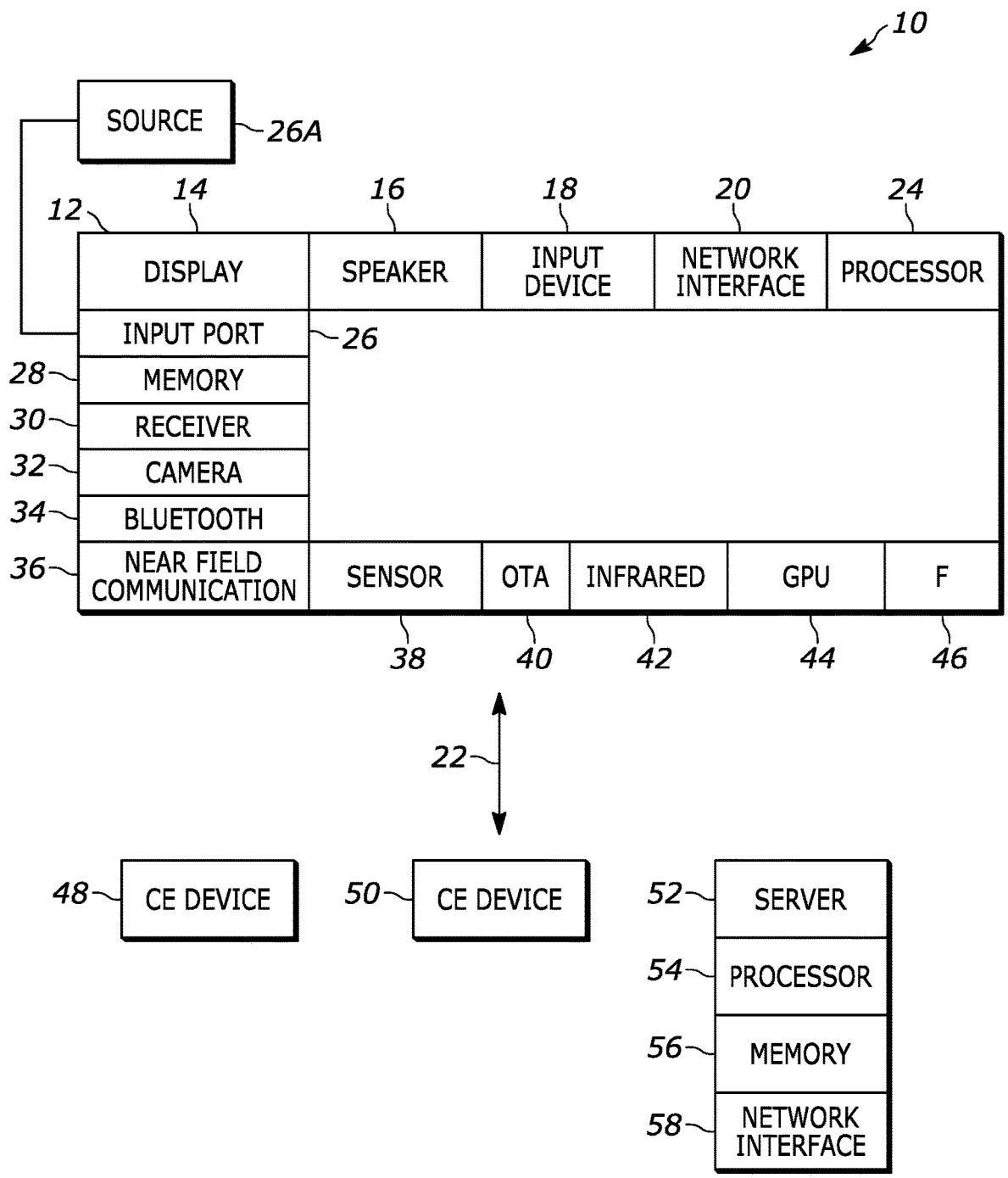
FIG. 1 is a block diagram of an example system including an example in accordance with present principles.

This disclosure relates generally to computer ecosystems including aspects of consumer electronics (CE) device networks such as but not limited to computer game networks. A system herein may include server and client components which may be connected over a network such that data may be exchanged between the client and server components. The client components may include one or more computing devices including game consoles such as Sony PlayStation® or a game console made by Microsoft or Nintendo or other manufacturer, virtual reality (VR) headsets, augmented reality (AR) headsets, portable televisions (e.g., smart TVs, Internet-enabled TVs), portable computers such as laptops and tablet computers, and other mobile devices including smart phones and additional examples discussed below. These client devices may operate with a variety of operating environments. For example, some of the client computers may employ, as examples, Linux operating systems, operating systems from Microsoft, or a Unix operating system, or operating systems produced by Apple, Inc., or Google. These operating environments may be used to execute one or more browsing programs, such as a browser made by Microsoft or Google or Mozilla or other browser program that can access websites hosted by the Internet servers discussed below. Also, an operating environment according to present principles may be used to execute one or more computer game programs.

Servers and/or gateways may include one or more processors executing instructions that configure the servers to receive and transmit data over a network such as the Internet. Or a client and server can be connected over a local intranet or a virtual private network. A server or controller may be instantiated by a game console such as a Sony PlayStation®, a personal computer, etc.

Information may be exchanged over a network between the clients and servers. To this end and for security, servers and/or clients can include firewalls, load balancers, temporary storages, and proxies, and other network infrastructure for reliability and security. One or more servers may form an apparatus that implement methods of providing a secure community such as an online social website to network members.

A processor may be a single- or multi-chip processor that can execute logic by means of various lines such as address lines, data lines, and control lines and registers and shift registers.

Components included in one embodiment can be used in other embodiments in any appropriate combination. For example, any of the various components described herein and/or depicted in the Figures may be combined, interchanged, or excluded from other embodiments.

"A system having at least one of A, B, and C" (likewise "a system having at least one of A, B, or C" and "a system having at least one of A, B, C") includes systems that have A alone, B alone, C alone, A and B together, A and C together, B and C together, and/or A, B, and C together, etc.

Now specifically referring to FIG. 1, an example system 10 is shown, which may include one or more of the example devices mentioned above and described further below in accordance with present principles. The first of the example devices included in the system 10 is a consumer electronics (CE) device such as an audio video device (AVD) 12 such as but not limited to an Internet-enabled TV with a TV tuner (equivalently, set top box controlling a TV). The AVD 12 alternatively may also be a computerized Internet enabled ("smart") telephone, a tablet computer, a notebook computer, a HMD, a wearable computerized device, a computerized Internet-enabled music player, computerized Internet-enabled headphones, a computerized Internet-enabled implantable device such as an implantable skin device, etc. Regardless, it is to be understood that the AVD 12 is configured to undertake present principles (e.g., communicate with other CE devices to undertake present principles, execute the logic described herein, and perform any other functions and/or operations described herein).

Accordingly, to undertake such principles the AVD 12 can be established by some or all of the components shown in FIG. 1. For example, the AVD 12 can include one or more displays 14 that may be implemented by a high definition or ultra-high definition "4K" or higher flat screen and that may be touch-enabled for receiving user input signals via touches on the display. The AVD 12 may include one or more speakers 16 for outputting audio in accordance with present principles, and at least one additional input device 18 such as an audio receiver/microphone for entering audible commands to the AVD 12 to control the AVD 12. The example AVD 12 may also include one or more network interfaces 20 for communication over at least one network 22 such as the Internet, an WAN, an LAN, etc. under control of one or more processors 24. A graphics processor may also be included. Thus, the interface 20 may be, without limitation, a Wi-Fi transceiver, which is an example of a wireless computer network interface, such as but not limited to a mesh network transceiver. It is to be understood that the processor 24 controls the AVD 12 to undertake present principles, including the other elements of the AVD 12 described herein such as controlling the display 14 to present images thereon and receiving input therefrom. Furthermore, note the network interface 20 may be a wired or wireless modem or router, or other appropriate interface such as a wireless telephony transceiver, or Wi-Fi transceiver as mentioned above, etc.

In addition to the foregoing, the AVD 12 may also include one or more input ports 26 such as a high-definition multimedia interface (HDMI) port or a USB port to physically connect to another CE device and/or a headphone port to connect headphones to the AVD 12 for presentation of audio from the AVD 12 to a user through the headphones. For example, the input port 26 may be connected via wire or wirelessly to a cable or satellite source 26a of audio video content. Thus, the source 26a may be a separate or integrated set top box, or a satellite receiver. Or the source 26a may be a game console or disk player containing content. The source 26a when implemented as a game console may include some or all of the components described below in relation to the CE device 44.

The AVD 12 may further include one or more computer memories 28 such as disk-based or solid-state storage that are not transitory signals, in some cases embodied in the chassis of the AVD as standalone devices or as a personal video recording device (PVR) or video disk player either internal or external to the chassis of the AVD for playing back AV programs or as removable memory media. Also, in some embodiments, the AVD 12 can include a position or location receiver such as but not limited to a cellphone receiver, GPS receiver and/or altimeter 30 that is configured to receive geographic position information from a satellite or cellphone base station and provide the information to the processor 24 and/or determine an altitude at which the AVD 12 is disposed in conjunction with the processor 24. The component 30 may also be implemented by an inertial measurement unit (IMU) that typically includes a combination of accelerometers, gyroscopes, and magnetometers to determine the location and orientation of the AVD 12 in three dimensions.

Continuing the description of the AVD 12, in some embodiments the AVD 12 may include one or more cameras 32 that may be a thermal imaging camera, a digital camera such as a webcam, and/or a camera integrated into the AVD 12 and controllable by the processor 24 to gather pictures/images and/or video in accordance with present principles. Also included on the AVD 12 may be a Bluetooth transceiver 34 and other Near Field Communication (NFC) element 36 for communication with other devices using Bluetooth and/or NFC technology, respectively. An example NFC element can be a radio frequency identification (RFID) element.

Further still, the AVD 12 may include one or more auxiliary sensors 38 (e.g., a motion sensor such as an accelerometer, gyroscope, cyclometer, or a magnetic sensor, an infrared (IR) sensor, an optical sensor, a speed and/or cadence sensor, a gesture sensor (e.g., for sensing gesture command), providing input to the processor 24. The AVD 12 may include an over-the-air TV broadcast port 40 for receiving OTA TV broadcasts providing input to the processor 24. In addition to the foregoing, it is noted that the AVD 12 may also include an infrared (IR) transmitter and/or IR receiver and/or IR transceiver 42 such as an IR data association (IRDA) device. A battery (not shown) may be provided for powering the AVD 12, as may be a kinetic energy harvester that may turn kinetic energy into power to charge the battery and/or power the AVD 12. A graphics processing unit (GPU) 44 and field programmable gated array 46 also may be included.

Still referring to FIG. 1, in addition to the AVD 12, the system 10 may include one or more other CE device types. In one example, a first CE device 48 may be a computer game console that can be used to send computer game audio and video to the AVD 12 via commands sent directly to the AVD 12 and/or through the below-described server while a second CE device 50 may include similar components as the first CE device 48. In the example shown, the second CE device 50 may be configured as a computer game controller manipulated by a player or a head-mounted display (HMD) worn by a player. In the example shown, only two CE devices are shown, it being understood that fewer or greater devices may be used. A device herein may implement some or all of the components shown for the AVD 12. Any of the components shown in the following figures may incorporate some or all of the components shown in the case of the AVD 12.

Now in reference to the afore-mentioned at least one server 52, it includes at least one server processor 54, at least one tangible computer readable storage medium 56 such as disk-based or solid-state storage, and at least one network interface 58 that, under control of the server processor 54, allows for communication with the other devices of FIG. 1 over the network 22, and indeed may facilitate communication between servers and client devices in accordance with present principles. Note that the network interface 58 may be, e.g., a wired or wireless modem or router, Wi-Fi transceiver, or other appropriate interface such as, e.g., a wireless telephony transceiver.

Accordingly, in some embodiments the server 52 may be an Internet server or an entire server "farm" and may include and perform "cloud" functions such that the devices of the system 10 may access a "cloud" environment via the server 52 in example embodiments for, e.g., network gaming applications. Or the server 52 may be implemented by one or more game consoles or other computers in the same room as the other devices shown in FIG. 1 or nearby.

The components shown in the following figures may include some or all components shown in FIG. 1.

Figure 2:
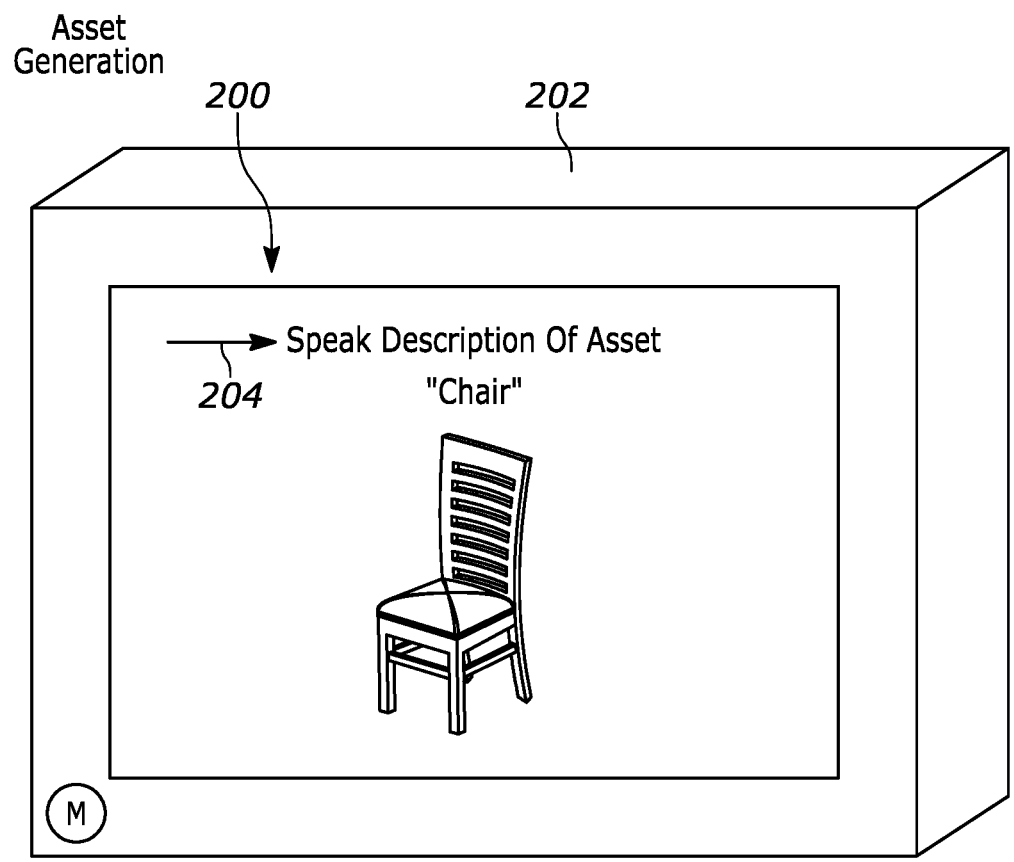
FIG. 2 illustrates an example screen shot prompting a person to enter speech for text identification of a computer simulation asset.
Figure 3:
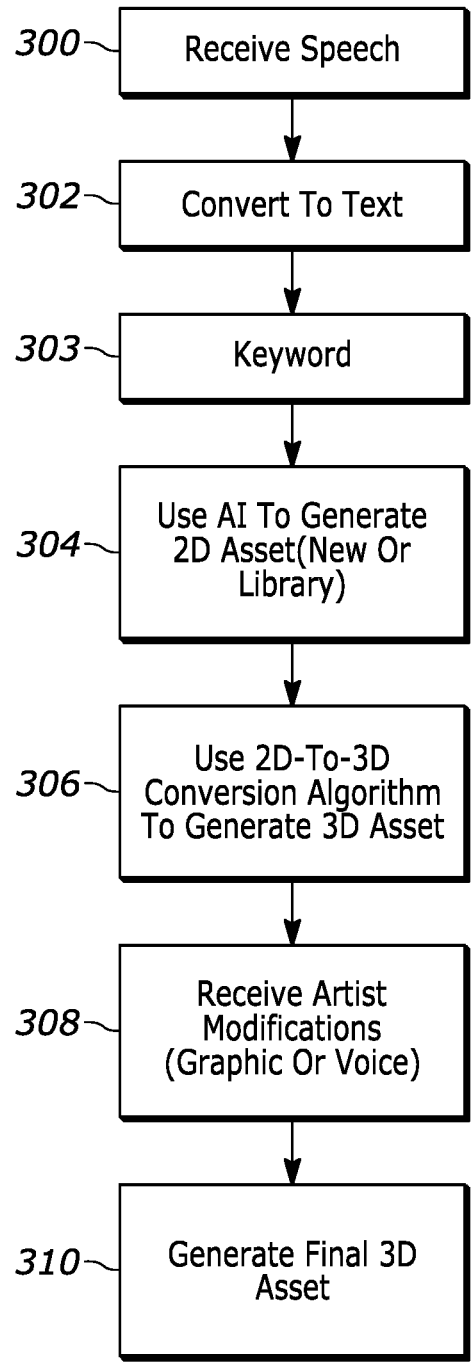
FIG. 3 illustrates example logic in example flow chart format for converting speech to text to a 3D asset.

FIGS. 2 and 3 illustrate techniques for allowing game designers to create and/or modify a three-dimensional (3D) asset for a computer simulation such as a computer game, typically a common non-character asset from scratch or by adapting an asset previously stored in an asset library.

As shown in FIG. 2, a user interface 200 may be presented on a display 202 such as any display described herein to prompt, at 204, a designer to speak the name of a desired asset, in the example shown, a chair.

FIG. 3 illustrates that the designer's ensuing speech (e.g., "brown chair with arms, 4-legs, cushioned surface and bannister back") is received at block 300 and converted to text at block 302. Block 303 indicates that keywords are extracted from the text using a text processing module to extract keywords. In the example, the output of the key word extraction may be:
  Object: chair
  Color: brown
  Leg: 4-legs
  Surface: cushioned
  Back: bannister The text may be input to an artificial intelligence (AI) engine such as one or more neural networks at block 304 to generate a 2D image of the requested asset. The image may be generated from scratch or may be selected by accessing a library of assets. A search of the library may first be made for images matching the keywords and only if no match is found may the AI engine generate, based on supervised or unsupervised training in human language, an image of the asset using a text to 2D or 3D generative model.

Proceeding from block 304 to block 306, the 2D image is converted to a 3D asset of the asset using a 2D-to-3D conversion system that uses, e.g., layer stacking or other technique such as creating 3D anaglyph stereograms, false height relief, etc. A 2D to 3D reconstruction model may be used. An encoder-decoder neural architecture may be included, where the encoder takes as input a 2D image and generates an encoding and the 3D decoder generates a 3D object based on the encoding. A 3D object or asset thus can be generated using 2D to 3D reconstruction, generating a 3D object using a generative neural model and then transforming it to meet the specs, or transforming an existing 3D model as per the desired specs. Further details are set forth in FIGS. 5 and 12-15.

The 3D asset may be presented on, e.g., the display shown in FIG. 2 and at block 308 artist modifications to the asset may be received using voice or other input such as point-and-click device graphical manipulation input. The modifications may include changes to size, shape, color, style of certain parts of the asset (but not to all parts of the asset), texture of the surface of the asset, etc. The final 3D asset after modification is generated at block 310 for use in a computer simulation.

Figure 4:
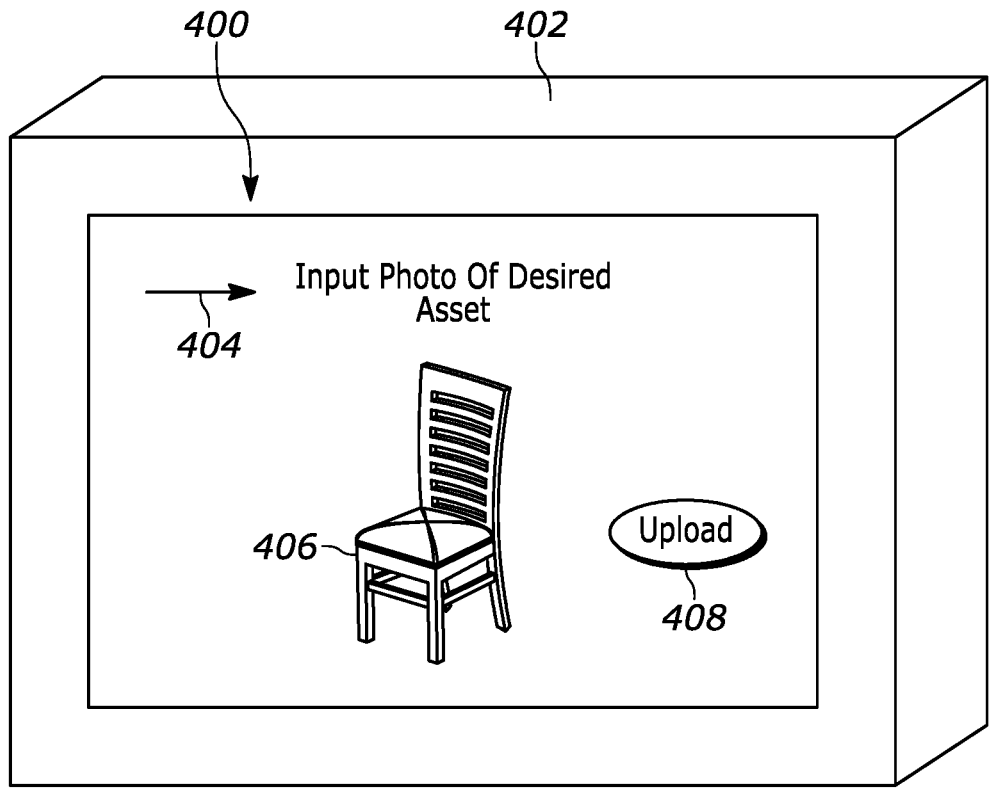
FIG. 4 illustrates an example screen shot prompting a person to enter an image for generation of a computer simulation asset.

FIG. 4 illustrates a UI 400 that may be presented on a display 402 such as any display divulged herein to prompt, at 404, a user to input a photograph of a desired asset. The photograph is depicted at 406 in 2D form and can be uploaded for processing in FIG. 5 by selecting an upload selector 408.

Figure 5:
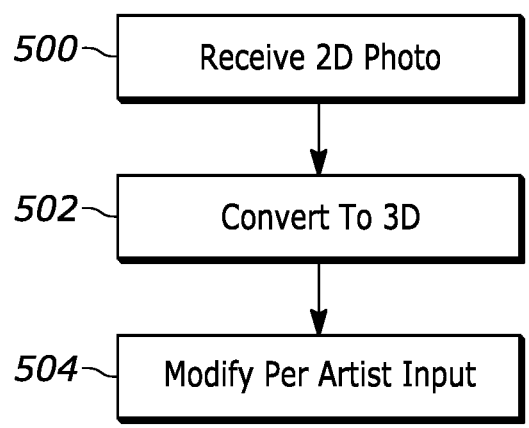
FIG. 5 illustrates example logic in example flow chart format for converting the image to a 3D asset.

FIG. 5 illustrates that the 2D image of the asset in the photo is received at block 500. Moving to block 502, the 2D image is converted to a 3D asset. Proceeding to block 504, the 3D asset may be modified as described herein by an artist or other user for use in a computer simulation. Additional details of 3D asset generation are illustrated in FIGS. 12-15 discussed below.

Figure 6:
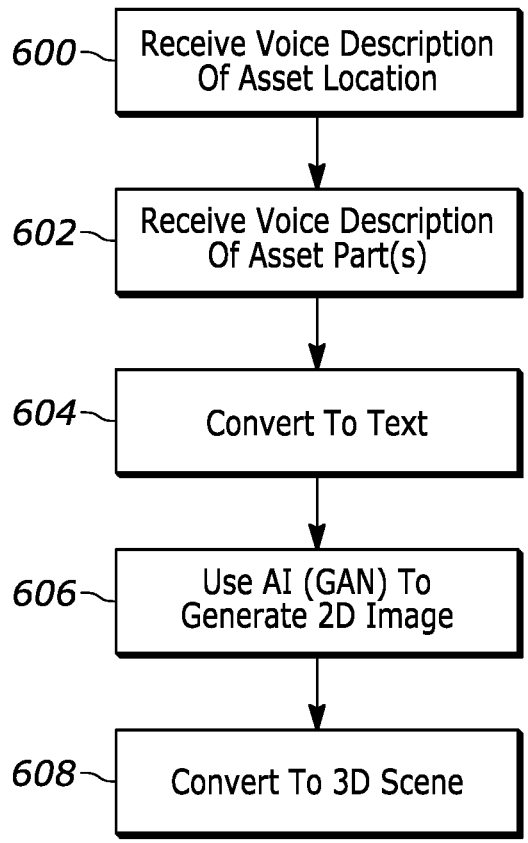
FIG. 6 illustrates example logic in example flow chart format for converting text from speech to location and parts of a 3D asset.

FIG. 6 illustrates example logic for specifying multiple assets and their desired relative locations to each other in a computer simulation. Commencing at block 600, text from direct text input or voice-to-text conversion is received describing the assets by name and their desired relative locations with respect to each other.

Moving to block 602, if desired a description also may be received of only part of an asset which does not apply to the entire asset. If the description is received as voice input, it is converted to text at block 604. An AI engine such as a generative adversarial network (GAN) may be used at block 606 to generate a 2D image based on the asset descriptions and locations received previously, with the image being converted to a 3D scene at block 608 according to principles discussed herein. A 3D asset may be generated directly without going through a 2D phase.

Figure 7:
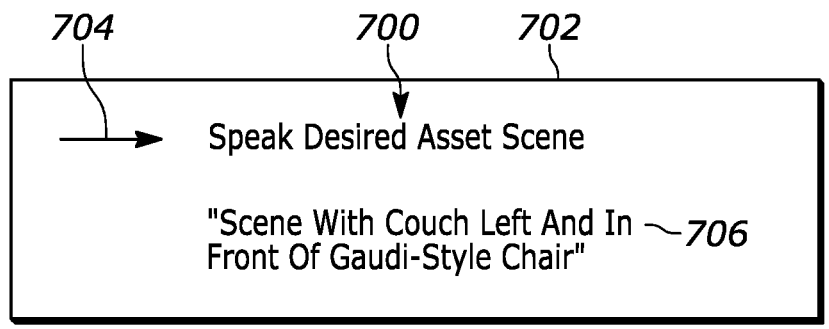
FIG. 7 illustrates an example screen shot related to FIG. 6.

FIG. 7 illustrates. A UI 700 may be presented on a display 702 such as any display described herein. The UI 700 may include a prompt 704 for a person to speak a description of the asset scene that is desired, which may be presented in text format after speech-to-text conversion at 706. In the example shown, the person has specified a scene with a couch to the left and in front of a chair styled as a Gaudi-style chair.

Figure 8:
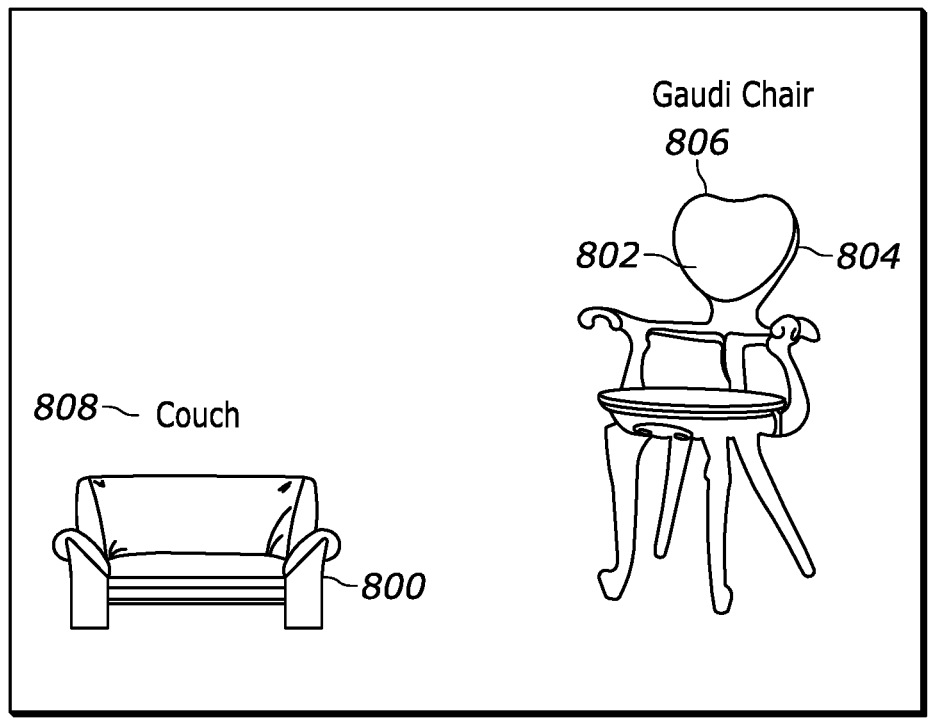
FIG. 8 illustrates an example screen shot related to FIG. 6.

FIG. 8 illustrates an example result of the process of FIG. 7. Continuing with the example set forth in FIG. 7, a 3D model 800 of a couch is shown to the left and in front of a 3D asset 802 of a chair, with the back 804 of the chair being in a Gaudi style as depicted by the frills 806. Labels 808 also may be presented by the respective assets indicating what the assets are intended to portray so that the artist can ascertain whether the GAN correctly executed the desired task.

One way to verify labels is to render the 3D model into a 2D image and use similarity metrics to compare the similarity between the 2D image generated from the text and the 2D image rendered from the 3D model.

Figure 9:
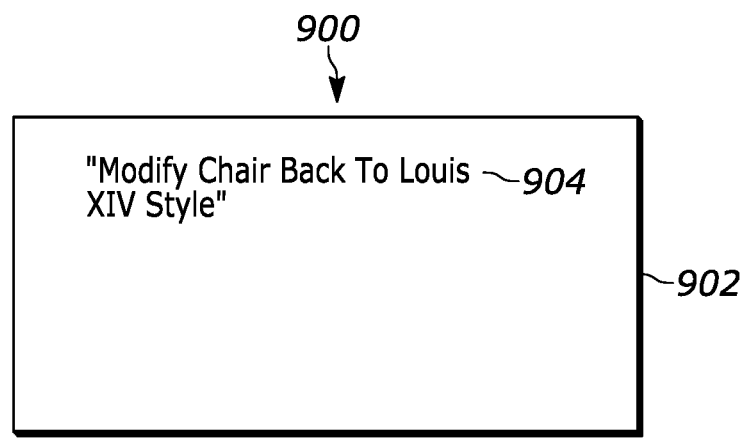
FIG. 9 illustrates an example screen shot related to FIG. 6 for modifying a part of an asset.

FIG. 9 illustrates a UI 900 that may be presented on a display 902 such as any display described herein. The UI 900 may include text 904 indicating text from, e.g., speech-to-text conversion from voice input of an artist to modify the chair shown in FIG. 8, in the example shown, from Gaudi style to Louis XIV style. This results in the frills on the back of the chair shown in FIG. 8 to change to a more ornate, courtly style to follow the example given.

Figure 10:
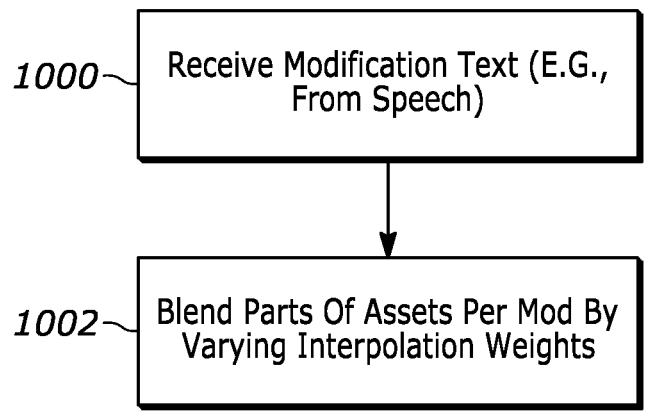
FIG. 10 illustrates example logic in example flow chart format for modifying a part of an asset.

FIG. 10 illustrates further principles related to disclosure above. At block 1000 text, e.g., as may be converted from speech, is received indicating a desired modification to an asset. Based on the desired modification, at block 1002 parts of the relevant asset are synthesized together as appropriate to satisfy the demanded modification. This may be done by varying the weights of interpolated pixels along the border regions in the asset at which the desired modification is identified as pertaining.

Note that in addition to assets, an artist may also vocally describe a desired background terrain, e.g., "dirt" or "palace marble" or other terrain. Also, as mentioned the size of an asset may be specified by the artist. For example, the artist may specify a chair that is twenty feet high. In the event that this causes the asset, once incorporated into game space of a simulation, to interfere with another asset such as a roof of an object, the roof may be caused to automatically appear as deforming to accommodate the chair. This may entail human-AI collaborative methods. An AI-only approach can be used to meet more qualitative requirements, like chair with a wide seat, or a tall back.

Figure 11:
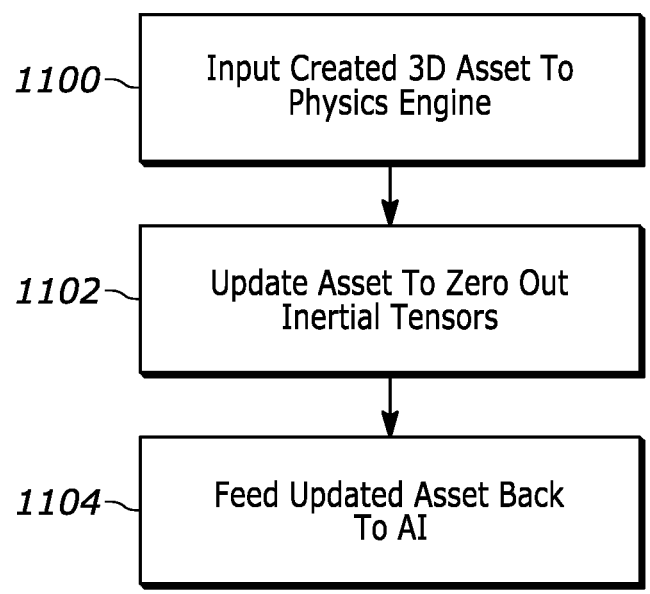
FIG. 11 illustrates example logic in example flow chart format for a closed loop processing between a 3D asset and a physics engine.

FIG. 11 illustrates an additional aspect. Once a 3D asset is created as described herein, it may be input to a physics engine at block 1100. Proceeding to block 1102, the asset geometry may be modified by, e.g., a GAN to maintain constant inertial tensors calculated by the physics engine to tend to move or deform the asset. Inertial tensors thus may be solved for by the physics engine to describe how an asset reacts to a force. For example, the physics engine can determine, based on present structural characteristics of the generated 3D asset, whether it tips over when pushed with a particular force.

In other words, an AI engine can look at physical properties of the structure of the asset and predict how the structure reacts to physics, to determine how to maintain a physics ratio of previous objects. Constraints may be imposed for this purpose, e.g., if the asset is a piece of furniture, it must be generated with attributes that prevent it from tipping over no matter how top heavy the 3D asset may be emulated to be, which may be accomplished by, e.g., maintaining total torques on various portions of the asset to be zero by, e.g., appropriately varying the dimensions and weights of the parts of the asset. In other words, a rule-based approach can be combined with AI for generating the object per se. The updated asset (or physics determinations for it) are fed back to the AI engine at block 1104.

In addition to visual properties, techniques described herein may be used to modify acoustic properties and material properties of assets using separate respective AI engines such as GANs. For example, a GAN may be employed to establish properties of an asset for how the asset absorbs force, e.g., does the asset shatter or crack if hit with a bullet, or does it absorb the bullet. An asset representing a grenade may be designed to have different kinds of explosions in the presence of different assets.

Figure 12:
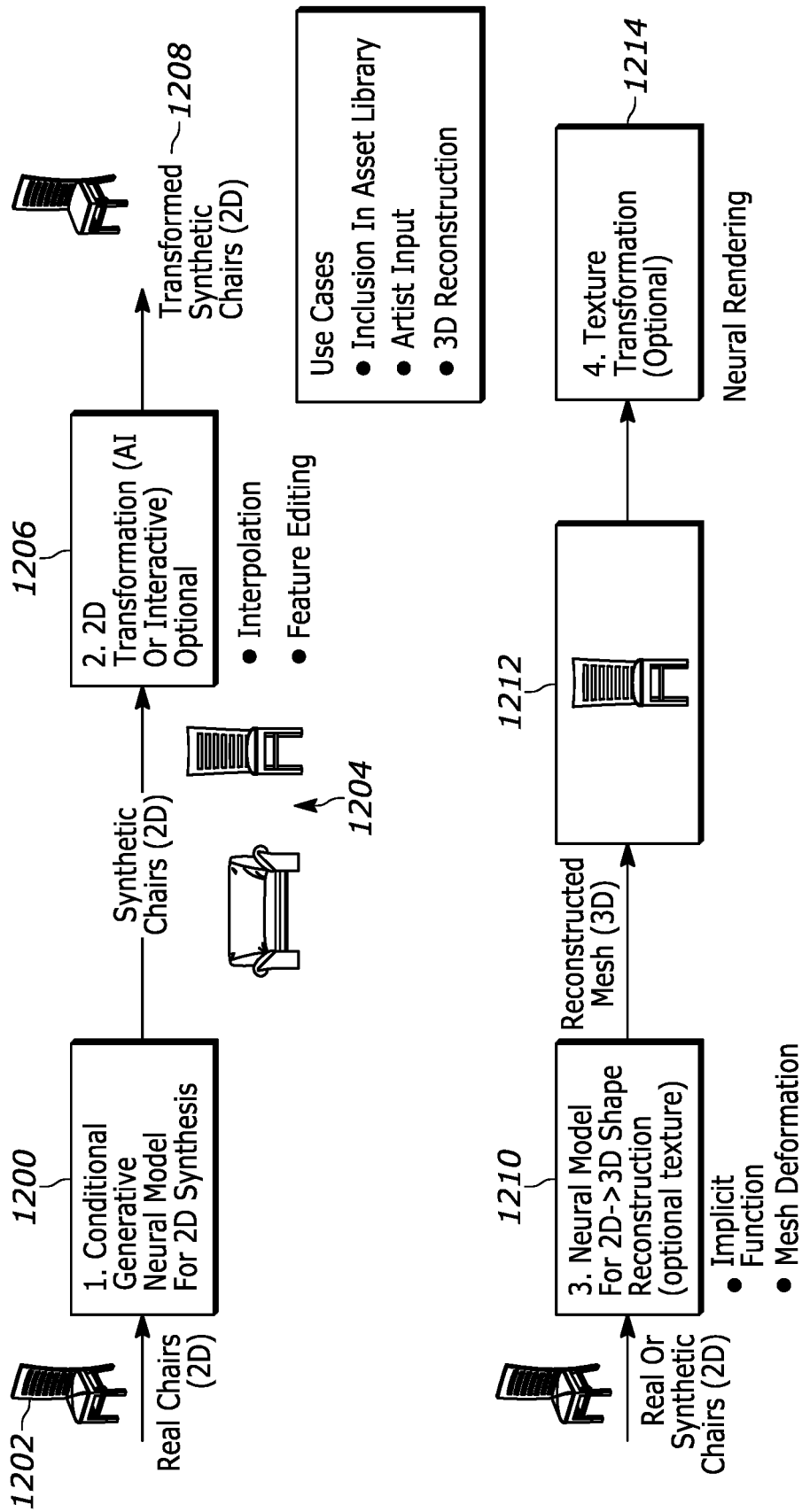
FIG. 12 illustrates an overview of a technique for 2D to 3D asset generation.

Now referring to FIG. 12, an overview of a technique for 2D to 3D graphic asset generation is shown. The technique of FIG. 12 is useful for new assets or when transforming existing 3D models is not viable. The technique supports generation and transformation.

Commencing at block 1200, representations 1202 such as photographs of real 2D objects such as chairs, to carry on the examples above, are input to a conditional generative neural model for 2D synthesis. The resulting output 1204 are representations of synthetic chairs in 2D. The output 1204 is sent to an optional 2D transformation model 1206 for interpolation and feature editing. The model 1206 may be entirely AI-based or it may be interactive between an AI model and a human operator.

The 2D transformation model 1206 outputs transformed synthetic representations 1208, in the example shown, of chairs in 2D. The representations 1208 may be included in an asset library, used for artist input, and used for 3D reconstruction.

Indeed, the transformed synthetic representations 1208 and/or representations 1202 of real assets in 2D such as chairs may be input to a neural model 1210. The neural model 1210 transforms the 2D representations into 3D shapes to output reconstructed meshes 1212 of the assets. The neural model 1210 involves an implicit function and mesh deformation as appropriate. If desired, the reconstructed meshes 1212 may be input to a texture transformation model 1214 for neural rendering of textures of the 3D asset.

Figure 13:
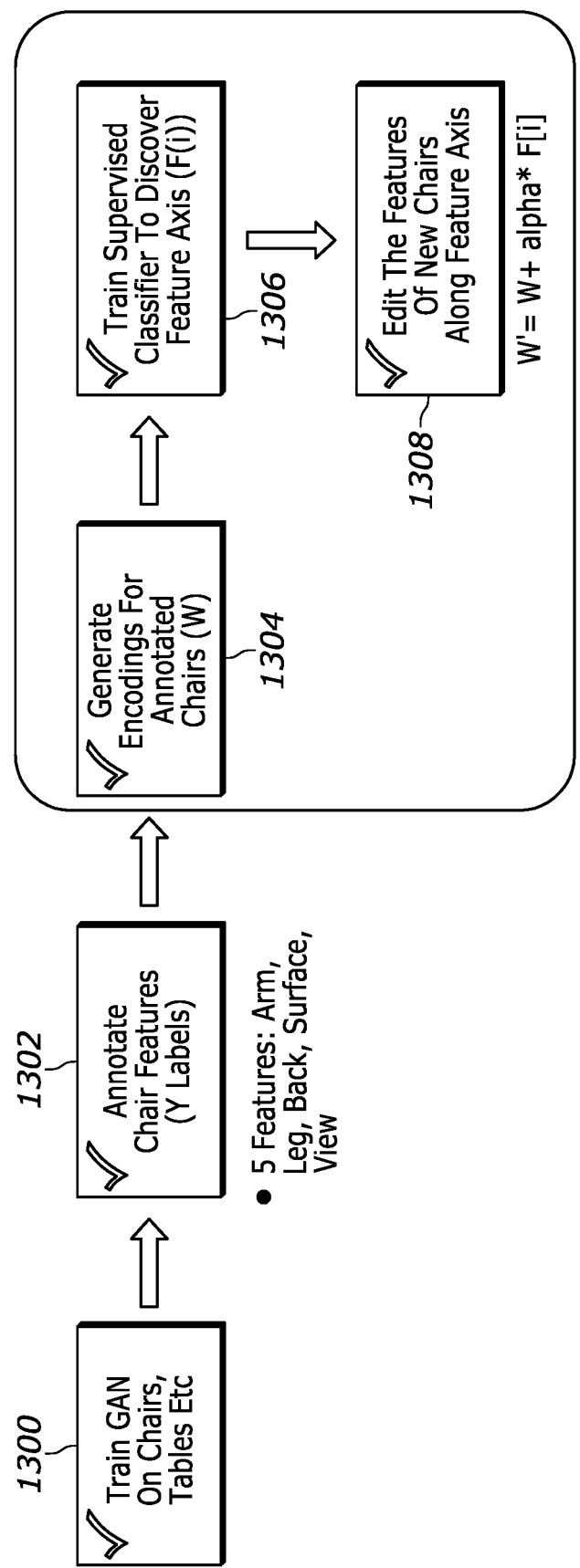
FIG. 13 illustrates a technique for controlled feature transformation.

FIG. 13 illustrates controlled feature transformation. Commencing at block 1300, 2D generative models (such as generative adversarial networks (GAN)) are trained on respective asset classes such as tables and chairs to generate assets. Training may be supervised, semi-supervised, or unsupervised.

When an asset is requested, the appropriate trained model is selected for the specified asset in the description. For example, if there are separate models to generate chairs, tables, etc., then the model is selected based on the specified asset.

The artist typically specifies what characteristic of the asset to transform, such as texture, color, and shape (geometry). To transform a generated asset to meet the specs in the input description, the generation is conditioned at block 1302 on the keywords (e.g., attributes) extracted from the description, that may be considered annotated features (y labels). In an example, five features of a chair may be used, i.e., arm, leg, back, surface, and view (front or back for instance).

Moving to block 1304, encodings may be generated for annotated chairs using different weights, which weights may be interpolated to best meet the artist specification. The encodings are sent to a train a supervised classifier 1306 to discover a feature axis F(i). At block 1308 the features may be edited for new chairs along with features axes, such that specific features are interactively controlled to transform the attributes (human-AI collaboration) to, for instance, change an existing chair asset to a chair with a bannister back. The encoding W' for the new chair thus is the encoding W of the previously existing chair plus the product of a alpha and the feature axis F(i), wherein alpha may be empirically determined or discovered.

Figure 14:
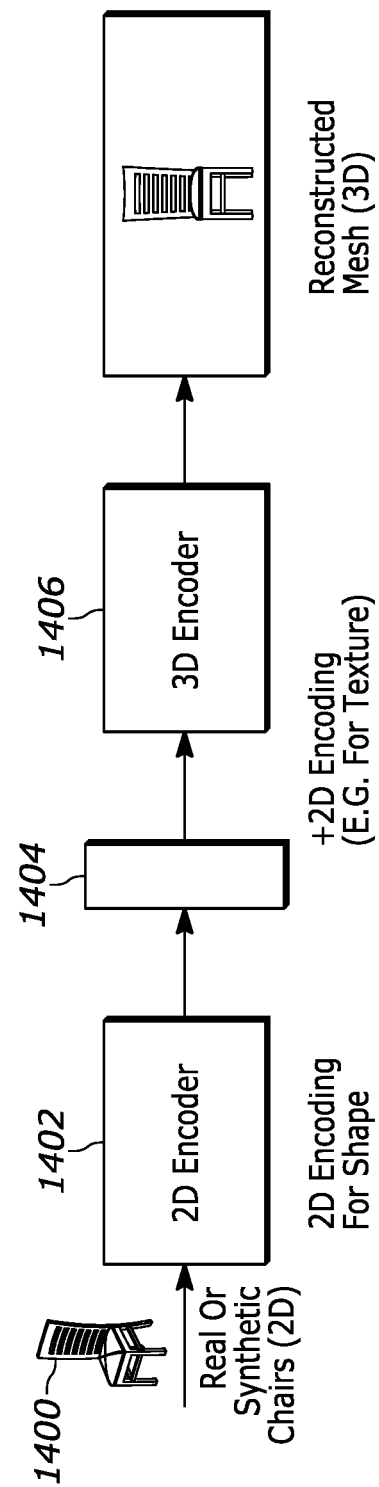
FIG. 14 illustrates 2D to 3D reconstruction approaches.

FIG. 14 illustrates further approaches. Representations 1400 of real or synthetic chairs in 2D are sent to a 2D encoder-decoder neural model 1402 for shape encoding. The 2D encoder model 1402 may be a convolutional network or similar deep neural network. The input 1400 to the encoder model 1402 may be the image generated and (optionally) transformed in FIG. 13 meet the description of the desired asset. If desired, a texture encoder 1404 also may be provided to encode texture of the object.

A 3D decoder 1406 takes the input encoding and generates the 3D object. The 3D decoder 1406 may also be a convolutional network or similar DNN. The output of the 3D decoder is a reconstructed mesh 1408 representing the 3D asset.

For training the network, the 3D output can be rendered to a 2D image and compared with the input image. The training can be iteratively continued until input and output are a close match. Mesh deformation alternatively may be used.

Encoder-decoder models may be adapted to incorporate additional encodings (for example, texture encodings) to transform the 3D objects to meet the specs in the description.

Figure 15:
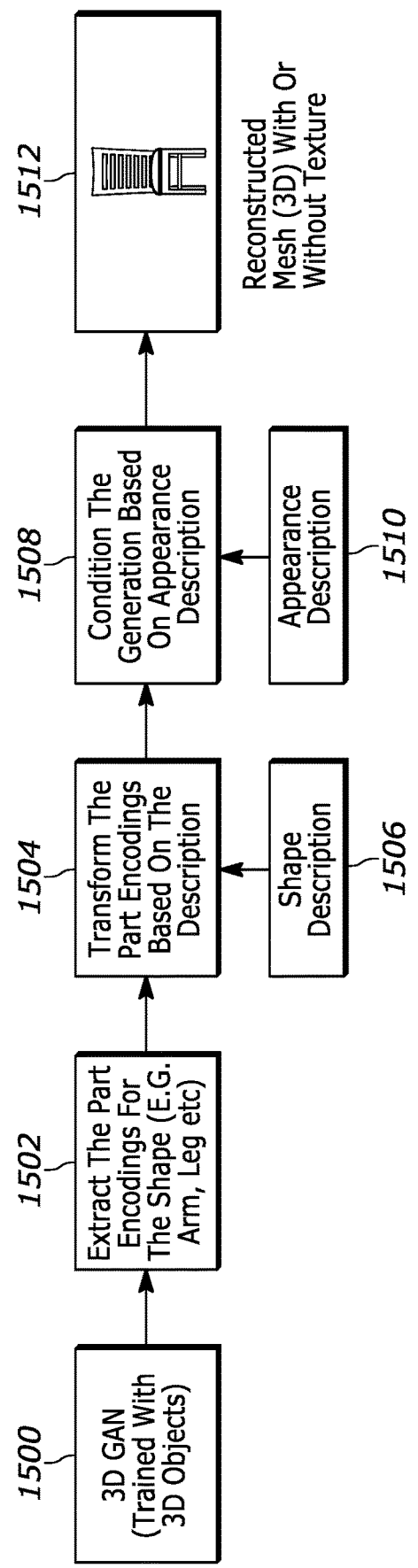
FIG. 15 illustrates a technique for 3D asset generation without 2D input.

Turning to FIG. 15 for an alternate approach to generating 3D assets, at block 1500 a 3D GAN model is trained to generate 3D object. The part encodings for each part of the asset, e.g., for a chair the encodings for the arms, legs, back, etc., are extracted at block 1502. Moving to block 1504, the part encodings are transformed based on the shape description 1506 of the desired asset. Proceeding to block 1508, the 3D asset generation is conditioned based on appearance descriptions 1510, such as non-shape descriptions such as style or size or color. The reconstructed mesh 1512 of the 3D asset is output with or without texturing, as desired. That is, the 3D asset model may be rendered based on a specified texture. 3D variations can be created based on specified attributes.

It will be appreciated that whilst present principals have been described with reference to some example embodiments, these are not intended to be limiting, and that various alternative arrangements may be used to implement the subject matter claimed herein.

What is claimed is:

1. A method comprising:
    using at least one neural network, generating a three-dimensional (3D) object of a computer simulation asset;
    processing information associated with the asset using at least one physics engine to render an output;
    feeding the output back to the neural network;
    receiving from the neural network a modified asset in response to feeding back the output of the physics engine to the neural network;
    rendering the output of the physics engine at least in part by modifying the information associated with the asset to maintain zero torque on plural portions of the asset; and
    using the asset in at least one computer game.

2. The method of claim 1, comprising modifying the asset geometry to maintain constant inertial tensors associated with the information associated with the asset.

3. The method of claim 1, comprising inputting at least one rule to the neural network for use in generating the 3D object.

4. The method of claim 1, comprising inputting to the neural network information defining how the asset absorbs force.

5. An apparatus comprising:
    at least one processor configured to:
    using at least one neural network, generate a three-dimensional (3D) object of a computer simulation asset;
    process information associated with the asset using at least one physics engine to render an output;
    feed the output back to the at least one neural network;
    receive from the at least one neural network a modified asset in response to feeding back the output of the physics engine to the at least one neural network;
    render the output of the physics engine at least in part by modifying the information associated with the asset to maintain zero torque on plural portions of the asset; and
    use the asset in at least one computer game.

6. The apparatus of claim 5, wherein the at least one processor is configured to modify the asset geometry to maintain constant inertial tensors associated with the information associated with the asset.

7. The apparatus of claim 5, wherein the at least one processor is configured to input at least one rule to the at least one neural network for use in generating the 3D object.

8. The apparatus of claim 5, wherein the at least one processor is configured to input to the at least one neural network information defining how the asset absorbs force.

9. An apparatus comprising:
    at least one computer medium that is not a transitory signal and that comprises instruction executable by at least one processor to:
    using at least one neural network, generate a three-dimensional (3D) object of a computer simulation asset;
    process information associated with the asset using at least one physics engine to render an output;
    feed the output back to the at least one neural network;
    receive from the at least one neural network a modified asset in response to feeding back the output of the physics engine to the at least one neural network;
    render the output of the physics engine at least in part by modifying the information associated with the asset to maintain zero torque on plural portions of the asset; and
    use the asset in at least one computer game.

10. The apparatus of claim 9, wherein the instructions are executable to modify the asset geometry to maintain constant inertial tensors associated with the information associated with the asset.

11. The apparatus of claim 9, wherein the instructions are executable to input at least one rule to the at least one neural network for use in generating the 3D object.

12. The apparatus of claim 9, wherein the instructions are executable to input to the at least one neural network information defining how the asset absorbs force.

* * * * *